(12) United States Patent
El-Ghoroury et al.

(10) Patent No.: US 6,724,331 B1
(45) Date of Patent: Apr. 20, 2004

(54) ADAPTIVE DIGITAL SPECTRAL COMPENSATION AND CALIBRATION OF ANALOG COMPONENTS AND TRANSCEIVER CHAINS

(75) Inventors: Hussein S. El-Ghoroury, Carlsbad, CA (US); Murat F. Karsi, Encinitas, CA (US)

(73) Assignee: Ellipsis Digital Systems, Inc., Carlsbad, CA (US)

( * ) Notice: Subject to any disclaimer, the term of this patent is extended or adjusted under 35 U.S.C. 154(b) by 0 days.

(21) Appl. No.: 10/304,331

(22) Filed: Nov. 26, 2002

Related U.S. Application Data
(60) Provisional application No. 60/333,990, filed on Nov. 27, 2001.

(51) Int. Cl.[7] .................................. H03M 1/06
(52) U.S. Cl. ..................... 341/118; 341/120
(58) Field of Search ................. 341/118, 120; 370/335, 342; 375/297, 345

(56) References Cited

U.S. PATENT DOCUMENTS 6,356,603 B1 * 3/2002 Martin et al. .............. 375/345
6,430,169 B1 * 8/2002 Harms et al. ............... 370/335

OTHER PUBLICATIONS

Razavi, Behzad, "RF Microelectronics", 1998, pp. 313–325, Prentice–Hall, Inc., Upper Saddle River, NJ.

* cited by examiner

Primary Examiner—Brian Young
Assistant Examiner—Joseph Lauture
(74) Attorney, Agent, or Firm—Blakely, Sokoloff, Taylor & Zafman LLP

(57) ABSTRACT

According to one aspect of the invention, an apparatus is provided which includes one or more analog components, an analog to digital (A/D) converter, and a spectral compensator. The operational characteristics of the one or more analog components have variations based on input signal frequency. The one or more analog components perform their corresponding operations with respect to an input analog signal to generate an output analog signal. The analog to digital (A/D) converter is coupled to receive the output analog signal from the one or more analog components and to convert the output analog signal to a digital signal. The spectral compensator is coupled to receive the digital signal generated by the A/D converter and to compensate spectral characteristics of the digital signal based on variations in the operational characteristics of the one or more analog components.

26 Claims, 3 Drawing Sheets

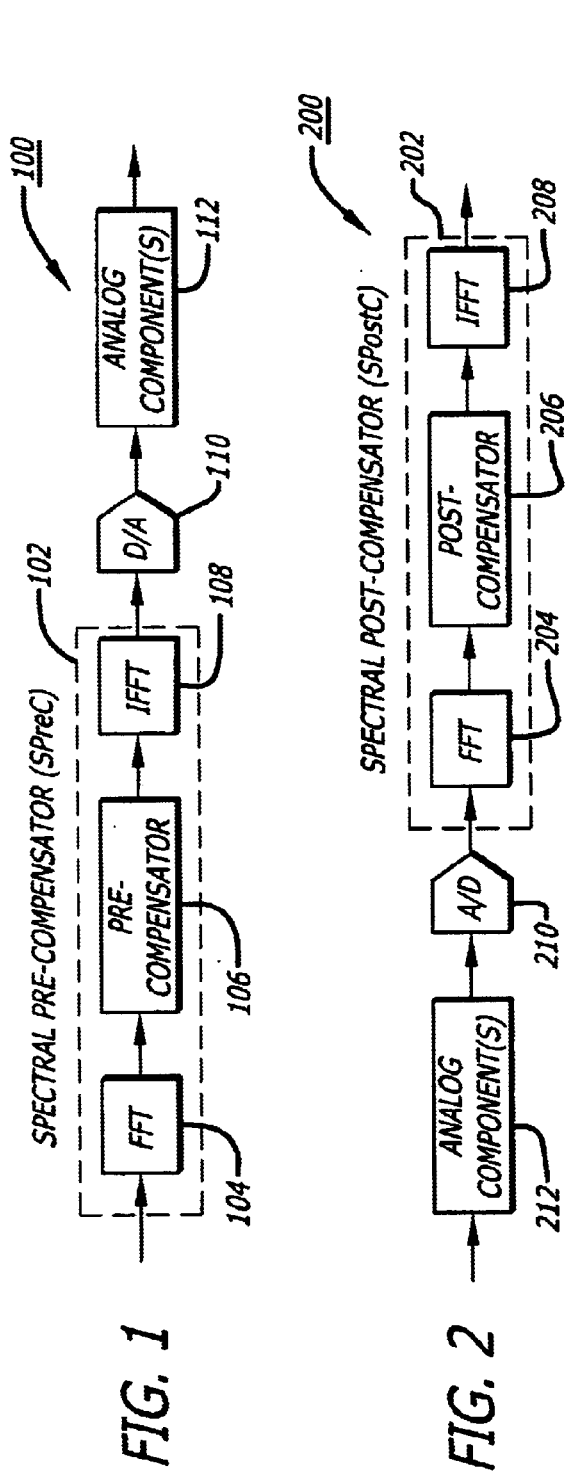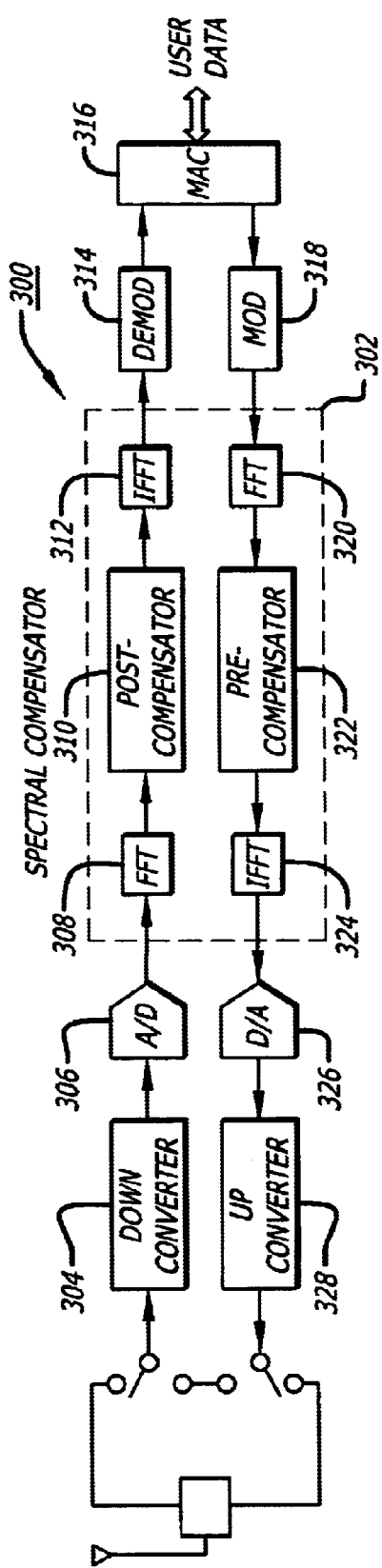

ADAPTIVE DIGITAL SPECTRAL COMPENSATION AND CALIBRATION OF ANALOG COMPONENTS AND TRANSCEIVER CHAINS

CROSS REFERENCE TO RELATED APPLICATIONS

This non-provisional United States (US) patent application claims the benefit of U.S. Provisional Application No. 60/333,990 filed on Nov. 27, 2001, by inventors Murat F. Karsi et al. entitled "ADAPTIVE DIGITAL COMPENSATION AND CALIBRATION OF RECEIVER AND TRANSCEIVER CHAINS."

BACKGROUND OF THE INVENTION (1) Field

The present invention relates to novel and inventive method, apparatus, and system to implement adaptive digital spectral compensation and calibration of analog components and transceiver chains.

(2) General Background

Potential tradeoffs between cost and performance are often made during the design and manufacturing of digital communications transceivers. Cost can be identified in financial terms, such as the cost of bill of materials (BOM) or cost required to assemble, calibrate and test the transceivers. Performance is typically identified through metrics such as sound clarity for voice communication, bit or packet error rate for data communication, etc.

Analog components of a digital communications receiver are significant contributors to the overall cost. Given a particular design, the best performance operation is typically obtained at a given nominal characteristics of system components. However, analog components typically display variations around their nominal characteristics. High performance analog components (e.g., filters with very high selectivity capability, quadrature receivers and transmitters with matching characteristics of the I and Q arms, etc.), and high precision analog components have higher costs. Thus, the utilization of these high performance and high precision analog components can significantly increase the overall cost of a transceiver.

In addition, analog component characteristics tend to vary as a result of temperature fluctuations, and also as the aging process of silicon occurs. These variations and the techniques and processes to compensate against these variations contribute to the cost vs. performance tradeoff.

Techniques or processes are used to trade off cost vs. performance can include:

1. Initial Factory Calibration Against Variations of the Transceiver Components Around Their Nominal Values and Temperature Variations Variations of analog components are due to manufacturing process variations of each individual component, or due to manufacturing process variations of the whole system from its components. Typical variations or variable characteristics can include:

a. Phase and Amplitude Transfer Characteristics of Filters and other system components—Typical system elements that will display such variations from nominal characteristics include receiver and transmitter selectivity and noise reduction filters, anti-aliasing filters (AAF), mismatches between and Q arms of receivers (I-Q imbalance), etc.

b. Linearity Characteristics of System Components— Deviation from desired linear characteristics lead to nonlinear characteristics. Examples of components that display such non-linear artifacts include Low Noise Amplifiers (LNA), mixers & power amplifiers (PA).

Calibration processes use a minimal of resources. For example, a calibration process should be completed in a minimum amount of time, and should use simple circuitry. However, many calibration processes have a lengthy completion time and use special control and sensor loops that would increase the cost of manufacturing.

2. Compensation Against Component and System Variations due to Effects of Aging and Temperature During Operation of the Transceiver During operation of the transceiver in the field, continued compensation against component and system variations against effects of aging and temperature are typically conducted in many communication systems. The measurements of the component characteristics, and compensation of the measured characteristics can be conducted either during the operation of the transceiver or during idle cycles of the transceiver. Typically such measurements require specialized circuitry embedded into the transceiver.

3. System Design Methods That Enable Utilization of Low Cost Analog System Components That Offers Reduced Performance and Low Precision These techniques include implementing digital (or analog) algorithms or circuit designs to compensate for effects resulting from usage of low cost analog components. In particular, digital calibration and compensation processes can be used to mitigate performance losses resulting from using low cost analog components to provide cost effective solutions.

In sampling and A/D conversion of signals, aliasing due to spectral fold over can be a performance limiter. In order to reduce the effects of aliasing, analog filters preceding the sampling and A/D converter units are used. These limit the bandwidth of the signal and eliminate aliasing or reduce the aliasing to acceptable levels.

However, there are several problems associated with analog anti-aliasing filters. In one exemplary problem, the cost of designing and implementing a circuit using analog anti-aliasing filters can be significantly higher that the cost of designing and implementing circuit using digital filters with selectivity characteristics similar to the analog filters. In another exemplary problem, the filter characteristics designed for certain I and Q paths may not exactly match due to problems associated with embedding to silicon, and may therefore lead to significant performance losses. In an additional exemplary problem, anti-aliasing filters can be typically specified to have sharp transition from pass band to stop band to avoid aliasing. The order of the filter would typically need to be increased to have the required sharp transition. As a result, the design and implementation cost may increase significantly. Thus, it would be desirable to develop processes enabling usage of anti-aliasing filters with relaxed requirements.

Some calibration and compensation processes focus on high performance high precision analog circuit designs. Two such processes can include:

1. Utilizing special electronic circuit configurations to automatically compensate against component variations or reduce system sensitivity against such variations; and 2. Utilizing silicon layout techniques to counteract component variations due to process and die variations (including common centroid layout techniques to counteract variations in the process to produce silicon at the fabrication facility).

However, these aforementioned processes would add to the cost of a device and would occupy additional silicon area.

Furthermore, many transceivers start their operation in the field with a post calibration characteristics arrived after factory calibration. Some semi-advanced transceivers utilize adaptive compensation algorithms that perform compensation of targeted specific components, such as power amplifier, power detectors, etc. However, a comprehensive compensation process that can compensate the overall transmitter and receiver characteristics is desirable.

Prior art factory calibration processes typically address the calibration of individual components that are most likely ones to display significant variations from one sample to another, or of individual components whose slight variations cause significant variations in system performance. Special circuitry are typically embedded into the Device-Under-Test (DUT), and into the test jig. An example of such special circuitry can include a special circuitry to compensate for mismatches of I and Q arms of transmitters and receivers. As the number of individual components that are to be calibrated increases, the total amount of special circuitry embedded into the DUT and into the test jig would significantly increase.

The total time required to calibrate all the components of a system would typically be the sum of the time needed to calibrate each of the components. As the system may include a multitude of components that require calibration, the total time required to calibrate all the components may become a significant overhead in the manufacturing process, and may significantly increase the production cost of the system. Furthermore, there is also a need for overall calibration of the system as well. For each component in a system, there exists a post-calibration tolerance level. That is, the calibration brings the characteristics of the component within a certain tolerance level of the desired characteristics. However, when these components operate within the larger system, the overall characteristics of the larger system may significantly vary from intended desired characteristics. To resolve such problem, each component would need to be calibrated at a higher level of precision. Unfortunately, calibrating each component at a higher level of precision would increase the cost the calibration process and thus the production cost of the system.

Another process involves using digital algorithms to detect and compensate for undesired features of analog components. Such digital algorithms have been used to compensate for imbalances in the I and Q arms of analog quadrature receivers used for down conversion, and for DC offset compensation in direct down conversion receivers. However, using digital algorithms require the design and implementation of such algorithms. In addition, these digital algorithms would consume additional power and would occupy additional valuable physical area on the chip.

Previous efforts to reduce cost of anti-aliasing filters can be based on the following premises:
1. Improvements on Analog IC Design Technology to Provide Cheaper and More Complex Filter Designs Although there have been improvements in analog IC design technology, these improvements do not match the drastic improvements of speed, power consumption and density of digital IC design technologies.
2. Methods of Analog Circuit Design and Implementation Unfortunately, even though some methods of analog circuit design and implementation can provide incremental performance improvements of performance, no revolutionary changes have been recorded.
3. Use of Higher Sampling Frequencies Based on the theory of signal processing, it is possible to use anti-aliasing filters with smoother transition between pass-band and stop-band as the sampling frequency of the signal increases. However, an increase in sampling frequencies would result in an increase in the cost of the circuitry that implements the A/D conversion. Also, power consumption would typically increase along with an increase in sampling frequencies. For example, it is well known that the power consumption of a CMOS ADC would doubles if the sampling frequency doubles.

The drawbacks of the prior compensation and calibration techniques or methods point towards a need to the desirability of a compensation and calibration method, system, and apparatus to reduce the cost of anti-aliasing filters.

BRIEF DESCRIPTION OF THE DRAWINGS

FIG. 1 shows a block diagram of an exemplary system for spectral pre-compensation of analog components in accordance with one embodiment of the invention;

FIG. 2 shows a block diagram of an exemplary system for spectral post-compensation of analog components in accordance with one embodiment of the invention;

FIG. 3 illustrates a block diagram of an exemplary transceiver spectral compensation system in accordance with one embodiment of the invention;

DETAILED DESCRIPTION OF THE INVENTION

Figure 4:
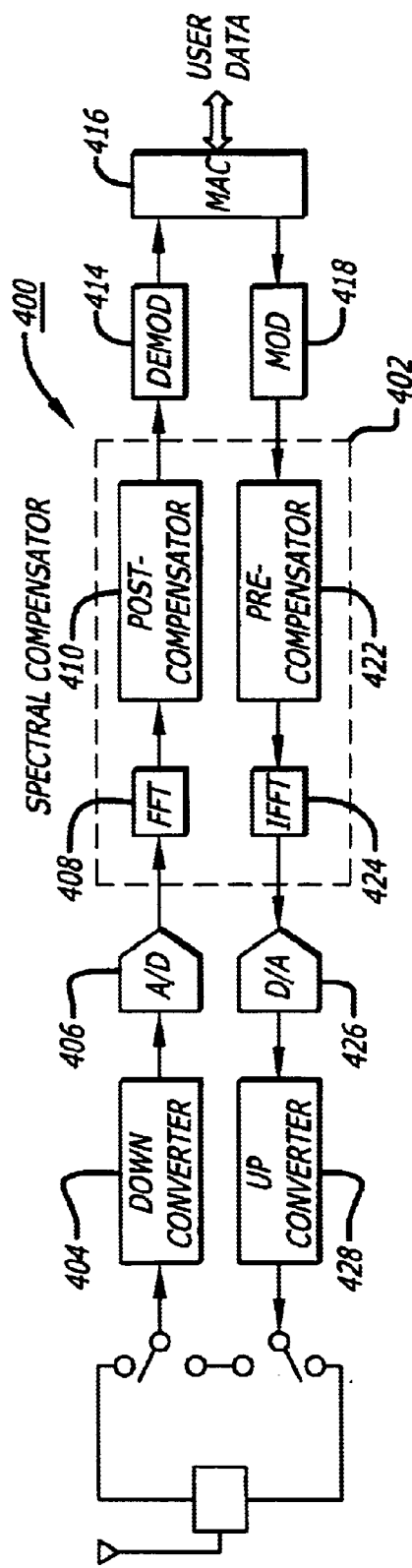
FIG. 4 illustrates a block diagram of an exemplary transceiver spectral calibration and compensation system for multi carrier communication systems, according to one embodiment of the invention.

The present invention relates to novel and inventive method, apparatus, and system to implement adaptive digital spectral compensation and calibration of analog components and transceiver chains.

A. General Description

The novel and inventive method, apparatus, and system to adaptive digital spectral compensation and calibration of analog and component chains can be generally used to address the following items:

1. Compensate undesired features of analog system components' spectral characteristics, and calibrate said compensation systems at the factory;
2. Compensate undesired features of analog filters' spectral characteristics, and, to calibrate said compensation systems at the factory;
3. Compensate undesired features of analog anti-aliasing filters spectral characteristics, and, to calibrate said compensation systems at the factory;
4. Compensate undesired features of transmitter and receiver chains' spectral characteristics, and, to calibrate said compensation systems at the factory;
5. Compensate undesired features of spectral characteristics of analog components, analog filters, anti-aliasing filters, transmitter chains and receiver chains in communication systems that utilize multi carrier modulation, and, to calibrate said compensation systems at the factory; and
6. Enable utilization of low cost analog system components that offers reduced performance and low precision. Calibration and compensation techniques are used to mitigate performance losses due to these analog components. As an example, the application of the method to utilizing low cost, increased transition bandwidth anti-aliasing filters is presented. Relatively smoother transition between pass band and stop band is obtained and the cost of anti-aliasing filter design and implementation can be reduced.

In the light of the traditional circuit design methods, it appears that there is need for generic digital compensation techniques to compensate analog component and communication system transceiver characteristics. Such digital compensation techniques would generally provide:

1. Lower cost and higher precision alternative to techniques to analog compensation techniques; and
2. Generic method of compensation that can be reused with minimal design effort.

FIG. 1 is a block diagram of an exemplary system 100 for spectral pre-compensation of analog components. The figure includes a Spectral Pre-Compensator (SPreC) unit 102 to compensate preceding spectral characteristics of analog components. In particular, the SPreC unit 102 compensates the phase and magnitude transfer characteristics of analog components over a desired bandwidth. Digital signal input into the SPreC unit 102 is pre-distorted by the unit to counteract the undesired spectral characteristics of non-ideal analog component(s) following the unit. The SPreC unit 102 should typically be designed such that the overall characteristics of the output of the system would be equivalent to the output of an ideal system having high precision analog component(s) having ideal spectral characteristics.

FIG. 2 is a block diagram of an exemplary system 200 for spectral post-compensation of analog components. This figure includes a Spectral Post-Compensator (SPostC) unit 202 to compensate spectral characteristics following analog component(s). In particular, the SPostC unit 202 compensates the phase and magnitude transfer characteristics of analog components over a desired bandwidth. Digital signal input into the SPostC unit 202 is post-distorted by the unit to generally counteract the undesired spectral characteristics of non-ideal analog component(s) preceding the unit. The SPostC 202 unit should typically be designed such that the overall characteristics of the output of the system would be equivalent to the output of an ideal system with high precision analog component(s) having ideal characteristics.

The analog component(s) of FIGS. 1 and 2 may include one or more of the following components or units:

1. One or more system analog system components whose operational characteristics may display undesired variations as a function of input signal frequency;
2. One or more analog filters whose operational characteristics may display undesired variations as a function of input signal frequency;
3. Analog anti-aliasing filters whose operational characteristics may display undesired variations as a function of input signal frequency; and
4. Analog transmitter or receiver chains whose operational characteristics may display undesired variations as a function of input signal frequency.

The described technique is generally suitable for compensating undesired variation of against receiver and transmitter chains in a communications transceiver. In a transmitter, the signals first exist in digital format and are then converted to analog format prior to transmission. Thus, a spectral pre-compensation technique is clearly suitable for pre-compensation of undesired variations of analog components in the transmitter strip. In a receiver, the received signals first exist in analog format and are then converted to digital format for digital processing. Thus, a spectral post-compensation technique is clearly suitable for post-compensation of undesired variations of analog components in the transmitter strip.

FIG. 3 shows a block diagram of an exemplary system 300 for compensation of receiver and transmitter chains of a transceiver. It is possible to establish a loopback mechanism to enable characterization of analog chains to define characteristics of the Post-Compensator 310 and Pre-Compensator 322 units included in the Spectral Compensator 302. In one embodiment, the loopback mechanism can be established by setting switches in the analog portion of the transceiver.

It should be noted that the control logic to identify the necessary pre-compensation and post compensation can either be circuitry external to or embedded in the SPreC unit or the SpostC unit.

Each of the SPreC and SPostC units can include an IFFT unit, a Pre-Compensator unit or Post-Compensator unit, and an FFT unit. It should be noted that the location of the IFFT unit and FFT unit can be interchangeable. For example, the first block in these systems may be an IFFT block and the last block may be an FFT block. The IFFT block converts its input signals to the frequency domain. Following the frequency domain conversion, operations on the frequency domain can then be implemented. For example, implementation of filtering is a multiplication of the output of the IFFT unit with complex numbers representing spectral characteristics of the desired filter. In the case of spectral post distortion, filter coefficients can be chosen to sufficiently compensate for the characteristics of the analog component(s) preceding the spectral post-compensator unit. In the case of spectral pre distortion, filter coefficients can be chosen to compensate for the characteristics of the analog component(s) following the spectral pre-compensator unit. The FFT unit can convert its input signal back to the time domain.

The Spectral Compensation system can adapt to changes in the undesired characteristics of analog component(s) during the operation of the designed system in the field. Also, through adaptation and calibration procedures, the Spectral Compensator system can be set up at the factory. One example of such procedures is calibration at the factory.

B. Compensation and Calibration of Transceivers for Multi-Carrier Communication Systems In recent years, several communication protocols have been incorporating multi carrier modulation format as the modulation choice. These communication protocols can include wireless LAN (e.g., IEEE 802.11 a) systems, DVB and DAB systems, and DSL (e.g., ADSL and VDSL) systems. Multi-carrier modulations, as well as several other modulations, of the communications protocols, can utilize IFFT and FFT as an integral part of modulation/demodulation process. As a result, the invention described in this disclosure is very suitable for use in such systems.

Due to the nature of the modulation format, it is possible to obtain a very efficient implementation by placing the SPreC and SPostC units prior to IFFT and after FFT sections of the transmitter and receiver, respectively. Thus, there is no need for additional FFT operation in the transmitter and also no need for an IFFT operation in the receiver as the modulation symbols are already considered to be in the "frequency domain" for such systems.

FIG. 4 illustrates an exemplary transceiver spectral calibration and compensation system 400 for multi carrier communication systems.

The calibration and compensation system shown in FIG. 4 can be applied to system components having relaxed requirements to compensate for the effects of the relaxed requirements. Compensating against effects of relaxed spectral or linearity requirements are possible. The compensation of such effects can be applied to receiver characteristics, transmitter characteristics, or both receiver and transmitter characteristics them. Furthermore, the calibration and compensation system of FIG. 4 can be implemented in baseband or bandpass frequencies, and can be used to compensate for characteristics of components operating at baseband and bandpass.

For multi-subcarrier modulations (e.g., OFDM/QAM), the compensation and calibration system of FIG. 4 enables the order of the filter to be reduced. Compensating the amplitude and phase distortions for each of the sub-carriers would reduce cost and complexity. The compensation and calibration system can be applied to OFDM systems each OFDM sub-carrier has constant level of the amplitude transfer function. As such, compensating the amplitude and phase distortion for each sub-carrier can be compensated using a complex multiplication after the FFT is performed on the received signal.

Typically, filter cutoff frequency (e.g., 3-dB) of the Anti-Aliasing filter (AAF) can be placed at the signal bandwidth. The order of the filter is chosen to obtain required suppression for rejection of aliasing and adjacent channel signal components. If a reduced order filter is utilized for the given level of suppression, the transition bandwidth of the filter should be wider. As a result, the reduced order filter will suppress some of the signal components. An example of this effect is shown below in FIG. 5, which shows exemplary amplitude transfer functions of two Butterworth filters (3 db-Bandwidth=7 Mhz) and (3 db-Bandwidth=10 Mhz), and exemplary representative effects of these filters on subcarriers of an OFDM modulated signal.

Figure 5:
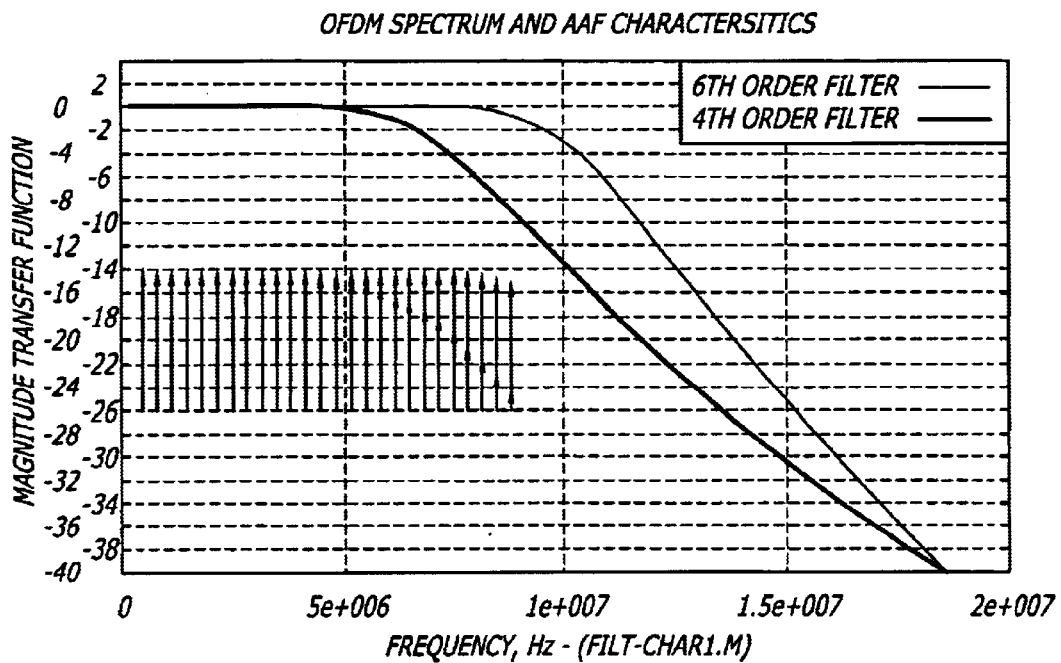
FIG. 5 shows exemplary amplitude transfer functions of two filters and exemplary representative effects of these filters on subcarriers of an OFDM modulated signal.

Two exemplary filters whose amplitude transfer functions are shown in FIG. 5. These exemplary filters include a Butterworth filter with 3-dB cutoff frequency of 7 MHz, and a Butterworth filter with 3-dB cutoff frequency of 10 MHz. Note that both filters provide the same rejection at about 18 MHz. OFDM sub-carriers are symbolically represented by impulses to provide a visualization of the effects of these filters.

Figure 6:
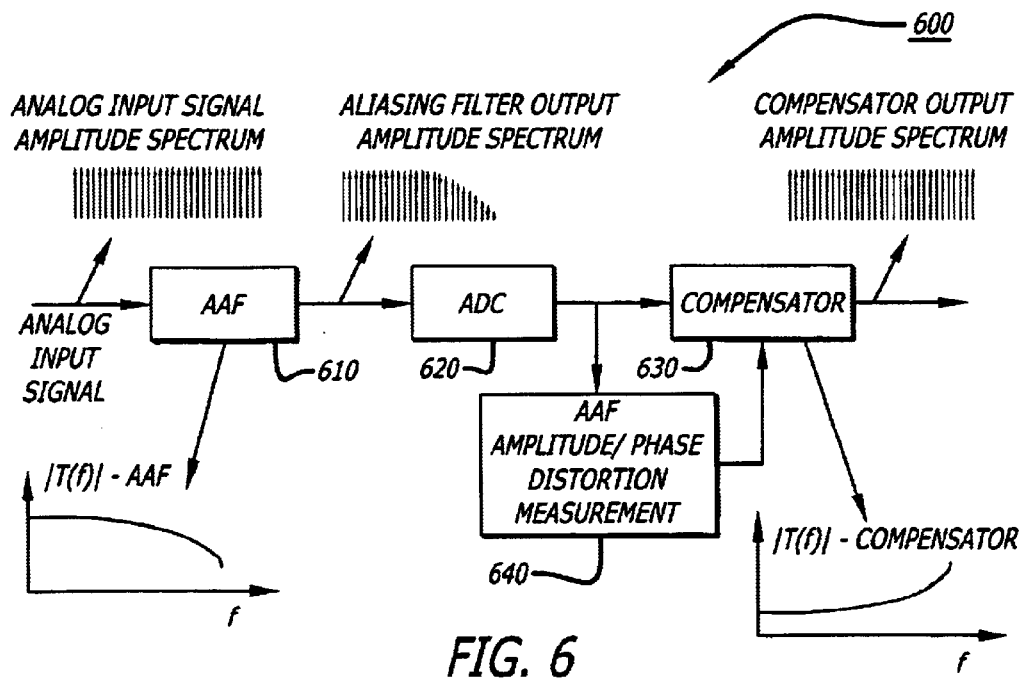
FIG. 6 shows a block diagram of an exemplary compensator system.

FIG. 6 shows a block diagram of an exemplary compensator system 600 and an exemplary symbolic representation of amplitude spectrum of signals. The compensator system of FIG. 6 can be used to compensate for distortions due to filter characteristics. One embodiment of the invention involves compensation of amplitude distortion due to a smooth transitioning anti aliasing filter. A conceptual presentation is shown above in FIG. 6. The signal at the ADC converter 620 output can be corrected by choosing an amplitude transfer function to reverse the effects of the AAF 610 on the received signal.

It should be noted that functional components, as shown in the figures and described above in the text accompanying the figures, could be implemented using software code segments. If the aforementioned functional components are implemented using software code segments, these code segments can be stored on a machine-readable medium, such as floppy disk, hard drive, CD-ROM, DVD, tape, memory, or any storage device that is accessible by a computing machine.

While certain exemplary embodiments have been described and shown in accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
   a spectral compensator coupled to receive a digital input signal;
   a digital to analog (D/A) converter coupled to the spectral compensator to receive a digital signal from the spectral compensator and to convert the digital signal to an analog signal; and
   one or more analog components coupled to the D/A converter to receive the analog signal from the D/A converter,
   the spectral compensator having coefficients determined during, calibration of the one or more analog components to pre-distort the spectral characteristics of the digital signal dependent on the spectral characteristics of the one or more analog components coupled to the D/A converter;
   wherein undesired spectral characteristics of the one or more analog components are compensated by the pre-distortion of the spectral compensator.

2. The apparatus of claim 1 wherein the digital input signal is transformed from time domain into frequency domain before being inputted to the spectral compensator.

3. The apparatus of claim 1 wherein the compensated digital signal generated by the spectral compensator is transformed from frequency domain to time domain.

4. The apparatus of claim 1 wherein the spectral compensator is configured to compensate the frequency domain phase and magnitude transfer characteristics of the one or more analog components over a particular bandwidth.

5. A method comprising:
   receiving an input digital signal;
   pre-distorting spectral characteristics of the input digital signal;
   converting the pre-distorted digital signal to an analog signal; and
   providing the analog signal to one or more analog components;
   the spectral characteristics of the input digital signal being pre-distort using coefficients determined during calibration with the one or more analog components to pre-distort the spectral characteristics of the digital input signal dependent on undesired spectral characteristics of the one or more analog components couple to the D/A converter.

6. The method of claim 5 further including:
   transforming the input digital signal from time domain into frequency domain before compensating spectral characteristics of the input digital signal.

7. The method of claim 5 further including:
   transforming the compensated digital signal from frequency domain to time domain before converting the compensated digital signal to analog signal.

8. The method of claim 5 wherein undesired spectral characteristics include:
   phase and magnitude transfer characteristics of the one or more analog components over a particular bandwidth.

9. An apparatus comprising:
   one or more analog components coupled to receive a analog signal;
   an analog to digital (A/D) converter coupled to receive an output analog signal from the one or more analog components and to convert the output analog signal to a digital signal; and
   a spectral compensator coupled to receive the digital signal generated by the A/D converter;
   the spectral compensator having coefficients determined during calibration of the one or more analog components to post-distort the spectral characteristics of the digital signal dependent on the undesired spectral characteristics of the one or more analog components.

10. The apparatus of claim 9 wherein the digital signal generated by the A/D converter is transformed from time domain into frequency domain before being inputted to the spectral compensator.

11. The apparatus of claim 9 wherein the compensated digital signal generated by the spectral compensator is transformed from frequency domain to time domain.

12. The apparatus of claim 9 wherein the spectral compensator is configured to compensate the frequency domain phase and magnitude transfer characteristics of the one or more analog components over a particular bandwidth.

13. A method comprising:

receiving an analog signal from one or more analog components;

converting the analog signal from the one or more analog components to a digital signal; and compensating spectral characteristics of the digital signal to generate a compensated digital signal using coefficients determined during calibration of the one or more analog components to post-distort the spectral characteristics of the digital signal dependent on the undesired spectral characteristics of the one or more analog components.

14. The method of claim 13 further including:

transforming the digital signal generated by the A/D converter from time domain into frequency domain before compensating spectral characteristics of the digital signal.

15. The method of claim 13 further including:

transforming the compensated digital signal generated by the spectral compensator from frequency domain to time domain.

16. The method of claim 13 wherein compensating spectral characteristics includes:

compensating phase and magnitude transfer characteristics of the one or more analog components over a particular bandwidth.

17. A system comprising:

a transmitter chain including:

a pre-compensator coupled to receive digital signals and perform spectral compensation on the digital signals before the digital signals are converted to analog signals and processed by one or more analog components in the transmitter chain, the digital signals being compensated based on undesired spectral characteristics of the one or more analog components in the transmitter chain using coefficients determined during calibration of the transmitter chain; and a digital to analog (D/A) converter coupled to receive and convert the compensated digital signals generated by the pre-compensator to analog signals to be processed by the one or more analog components in the transmitter chain; and a receiver chain including:

an analog to digital (A/D) converter coupled to receive analog signals generated by one or more analog components in the receiver chain and convert the analog signals to digital signals; and a post-compensator coupled to receive and perform spectral compensation on the digital signals generated by the A/D converter, the digital signals being compensated based on undesired spectral characteristics of the one or more analog components in the receiver chain using coefficients determined during calibration of the transmitter chain.

18. The system of claim 17 wherein the pre-compensator is configured to compensate phase and magnitude transfer characteristics of the one or more analog components in the transmitter chain over a particular bandwidth.

19. The system of claim 17 wherein the post-compensator is configured to compensate phase and magnitude transfer characteristics of the one or more analog components in the receiver chain over a particular bandwidth.

20. The system of claim 17 wherein the digital signals in the transmitter chain are transformed from time domain to frequency domain before being compensated by the pre-compensator and transformed from frequency domain to time domain after being compensated by the pre-compensator.

21. The system of claim 17 wherein the digital signals in the receiver chain are transformed from time domain to frequency domain before being compensated by the post-compensator and transformed from frequency domain to time domain after being compensated by the post-compensator.

22. The system of claim 17 wherein the pre-compensator and post-compensator are coupled with transmit and receive chains used in multi-carrier transceiver systems that utilize frequency domain multi-carrier modulation techniques.

23. The system of claim 17 wherein the transmit and receive chains are coupled through set of loop-back switches coupling the output of the transmit chain to the input of the received chain to allow adaptive calibration of the transmitter and receiver chains using the pre-compensator and post-compensator.

24. An apparatus comprising:

an anti-aliasing filter (AAF) coupled to receive an input analog signal and perform anti-aliasing filtering function on the input analog signal to generate an output analog signal, the output analog signal generated by the AAF having spectral distortion;

an analog to digital (A/D) converter coupled to convert the output analog signal generated by the AAF to a digital signal; and a spectral compensator unit coupled to receive the digital signal generated by the (A/D) converter and perform a spectral compensation function on the digital signal to compensate for spectral distortion caused by the AAF based on spectral distortion measurements of the digital signal generated by the (A/D) converter, the spectral compensator having coefficients determined during calibration with the AAF.

25. The apparatus of claim 24 wherein the spectral compensator performs compensation of frequency domain amplitude distortion caused by the AAF.

26. The apparatus of claim 24 further including a spectral distortion measurement unit coupled to measure the spectral distortion of the digital signal generated by the (A/D) converter and provide spectral distortion information to the spectral compensator.

* * * * *